US009507662B2

(12) United States Patent  
Andre

(10) Patent No.: US 9,507,662 B2  
(45) Date of Patent: Nov. 29, 2016

(54) EXPANDED ERROR CORRECTION CODES

(71) Applicant: Everspin Technologies, Inc., Chandler, AZ (US)

(72) Inventor: Thomas Andre, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 177 days.

(21) Appl. No.: 14/495,713

(22) Filed: Sep. 24, 2014

(65) Prior Publication Data

US 2016/0085622 A1  Mar. 24, 2016

(51) Int. Cl.
| | |
|---|---|
| *G06F 11/10* | (2006.01) |
| *G06F 3/06* | (2006.01) |
| *H03M 13/29* | (2006.01) |
| *H03M 13/43* | (2006.01) |
| *H03M 13/19* | (2006.01) |
| *H03M 13/09* | (2006.01) |
| *H04L 1/00* | (2006.01) |
| *H03M 13/15* | (2006.01) |
| *G11C 11/16* | (2006.01) |

(52) U.S. Cl.
CPC ........... *G06F 11/1008* (2013.01); *G06F 3/064* (2013.01); *G06F 3/0619* (2013.01); *G06F 3/0673* (2013.01); *G06F 11/10* (2013.01); *G06F 11/1004* (2013.01); *G06F 11/104* (2013.01); *G06F 11/106* (2013.01); *G06F 11/1044* (2013.01); *G06F 11/1048* (2013.01); *G06F 11/1068* (2013.01); *G06F 11/1076* (2013.01); *G11C 11/16* (2013.01); *H03M 13/091* (2013.01); *H03M 13/15* (2013.01); *H03M 13/19* (2013.01); *H03M 13/2906* (2013.01); *H03M 13/43* (2013.01); *H04L 1/0045* (2013.01); *H04L 1/0057* (2013.01); *H04L 1/0061* (2013.01)

(58) Field of Classification Search
CPC .... G06F 3/0619; G06F 3/064; G06F 3/0673; G06F 11/1008; G06F 11/1048; G06F 11/1076; G06F 11/106; G06F 11/104; G06F 11/10; G06F 11/1004; G06F 11/1068; G06F 1/1044; H03M 13/2906; H03M 13/43; H03M 13/19; H03M 13/15; H03M 13/091; H04L 1/0057; H04L 1/0045; H04L 1/0061
USPC ......... 714/764, 763, 770, E11.013, 6.2, 760, 714/807, E11.023, E11.034
See application file for complete search history.

(56) References Cited

U.S. PATENT DOCUMENTS

| | | | | |
|---|---|---|---|---|
| 5,465,262 | A   * | 11/1995 | Dell ................... | G06F 11/1044 714/800 |
| 9,112,536 | B2 * | 8/2015 | Alam .................. | G06F 11/1048 |
| 2010/0241927 | A1* | 9/2010 | Soma .................. | G06F 11/1052 714/760 |
| 2012/0195112 | A1* | 8/2012 | Alam .................. | G06F 11/1048 365/158 |
| 2012/0198313 | A1* | 8/2012 | Alam .................. | G06F 11/1048 714/773 |
| 2014/0372792 | A1* | 12/2014 | Slaughter ............ | G11C 11/1673 714/6.13 |
| 2015/0355967 | A1* | 12/2015 | Alam .................. | G06F 11/1048 714/764 |

* cited by examiner

*Primary Examiner* — John J Tabone, Jr.
(74) *Attorney, Agent, or Firm* — Lee & Hayes, PLLC

(57) ABSTRACT

In some examples, a memory device may be configured to store data in either an original or an inverted state based at least in part on whether the majority of bits are set to a high state or a low state. For instance, the memory device may be configured to set each bit in the memory array to a low state when the data is read. The memory device may then be configured to store the data in the original state when a majority of the bits to be written to the array are in the low state and in the inverted state when the majority of the bits to be written to the array are in the high state.

20 Claims, 6 Drawing Sheets

EXPANDED ERROR CORRECTION CODES

BACKGROUND

In magnetic memory devices, such as magnetic random access memories (MRAMs), the energy consumption rates and the error rates associated with reading or writing data from an array may be higher than comparable non-magnetic memory devices, such as dynamic random access memories (DRAMs).

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
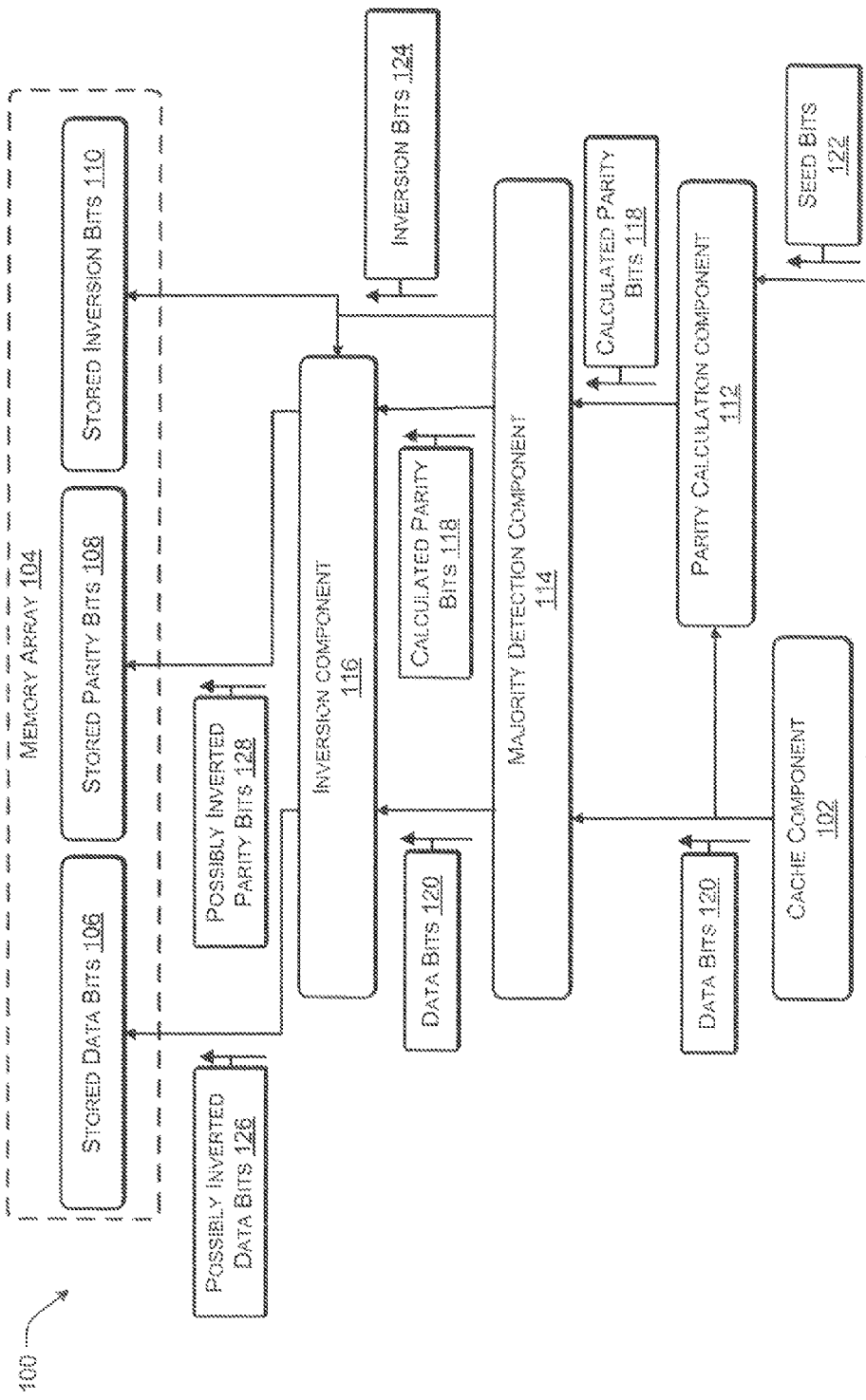
FIG. 1 illustrates a block diagram showing select components of a memory device according to some implementations.

This disclosure includes techniques and implementations to improve the reliability and energy consumption rates associated with accessing data stored in memory devices. In some examples, magnetic memories, such as magnetic random access memories (MRAMs) are configured to perform self-referencing reads, which may require switching or setting each bit when the data stored in the memory arrays are loaded into a cache. For instance, in some types of devices, following the completion of the activate operations each of bits in the array associated with the data read may be set to zero or placed in a low restive state.

In some implementations described herein, in response to a precharge command, the memory device may perform a majority detection on the bits stored in the cache before storing the bits in the array. The majority detection may determine if a larger number of the bits are zero (e.g., in a low resistive state) or if a larger number of the bits are ones (e.g., in a high resistive state). In these implementations, if the memory device determines that more of the bits are ones than zeros, the memory device may invert each of the bits, set an inversion bit, and write the inverted bits and the inversion bit into the array. By inverting the bits when a greater number of ones are detected, the memory device is able to switch fewer bits (as the bits in the array were set to zero following the completion of the activate operations). Thereby, the memory device may experience improved energy consumption associated with writing data into the array, as on average fewer bits are set in response to each precharge command.

In some cases, the error rates associated with reading and writing data to and from a magnetic memory device may be greater than the error rate associated with reading and writing data in other types of memory devices, such as dynamic access memories (DRAMs). In these cases, the magnetic memory device may include more robust error correction codes (ECC), for example double error correction may be implemented. Unfortunately, when the inversion bit is utilized and stored in the memory device as described above, the inversion bit is also susceptible to errors. Therefore, in some implementations, the inversion bit may be included in the ECC word associated with the corresponding data bits, as typical ECC circuits are capable of correction more bits than the number of data bits assigned to each ECC word. In other implementations, each ECC word may have an associated inversion bit, however, the inversion bit may not be included in the ECC word. For instance, in some cases, configuring the inversion bits on a separate error correction scheme may allow for improved system level error correction.

In some implementations, the parity bits may also be associated with the ECC words and, in some cases, in the majority detection and inversion. For instance, in some examples, the parity bits may form a significant portion of the bits being stored in the array. For example, if double error correction is implemented and an ECC word include sixty four data bits, the fourteen parity bits or eighteen percent of the bits being written to the array would not experience the power savings associated with performing the majority detection and inversion, described above.

In some instances, the inverted parity bits stored in the array may not match the calculated parity bits generated by the ECC circuits when the inverted bits are accessed. Therefore, implementations and memory devices are described herein in which the ECC circuits are configured to generate parity bits that produce a matching encoding when the parity bits are generated from the original data bits and inverted or when the parity bits are generated from the inverted data bits. For example, in some implementations, the memory device may be configured such that the number of inputs associated with generating each parity bit is odd and, thereby causing the parity bits generated from the inverted data bits and the inverted parity bits generated from the original data bits to produce parity/difference information or a encoding that indicates no errors when no errors occurred.

Therefore, implementations and memory devices are described herein, in which the data bits, parity bits, inversions bits, and/or a combination thereof are included in a majority detection and inversion scheme associated with writing data into the memory array. Additionally, implementations and memory devices are described herein, in which the ECC circuits of the memory device are configured to generate parity encoding in which the inverted parity bits matches the parity bits calculated from inverted data bits. In some examples, the inversion bits may be included in the ECC words and, thereby included in the parity calculations and the error correction associated with the memory device.

FIG. 1 illustrates a block diagram showing select components of a memory device 100 according to some implementations. In the illustrated example, data stored in a cache component 102 is being written back into the memory array 104 in response to receiving a precharge command. In general, the memory device 100 is an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, solid state storage, magnetic disk storage, RAID storage systems, storage arrays, network attached storage, storage area networks, cloud storage, or any other medium that can be used to store information and which can be accessed by a processors.

The memory device 100 includes one or more memory arrays, such as memory arrays 104. The memory array 104 may be configured to store data blocks including data bits 106, parity bits 108 (or check bits), and inversion bits 110 associated with an ECC word. The data bits 106 contain data, which is intended to be read from the memory array 104. The parity bits 108 are bits that are stored together with the data bits 106 and are utilized to determine whether an error has occurred during a read or write operation when the data bits 106 are being accessed. The inversion bits 110 are stored together with the data bits 106 and the parity bits 108 and indicate whether the data bits 106 and the parity bits 108 are stored in an original state or in an inverted state.

The memory device 100 also includes a parity calculation component 112, a majority detection component 114, and an inversion component 116. The parity calculation component 112 may be configured to generate calculated parity bits 118 based at least in part on data bits 120 and one or more seed bits 122 received as part of the precharge operations. The majority detection component 114 may be configured to determine the most common bit state associated with the data bits 120 and the calculated parity bits 118 and, in response set one or more inversion bits 124. The inversion component 116 may be configured to receive the data bits 120, the parity bits 118, and the inversion bits 124 and to invert the data bits 120 and the parity bits 118 when indicated by the inversion bits 124.

In this example, the stored data bits 106, the stored parity bits 108, and the stored inversion bits 110 are set to zero or placed in a low restive state when the data is read from the array 104 in response to receiving an activate command from an external source (not shown). As the bits associated with the stored data bits 106, the stored parity bits 108, and the sorted inversion bits 110 are set to zero when read from the memory array 104, when the data is written back into the array only the bits having a value of one are switched. Therefore, by configuring the data to be written into the array 104 to include primarily zeros, less power is consumed with respect to each precharge command received from the external source.

In general, the memory device 100 receives a precharge command and, in response the memory device access the data bits 120 stored in the cache component 102. The memory device 100 provides the data bits 120, as well as one or more seed bits 122 to the parity calculation component 112. In some implementations, the seed bits 122 are inversion bits placed in the non-inverting state. For example, the seed bits 122 may include a single seed bit set to zero or a value associated with a low state when the inversion bit having a value of zero indicates the data bits 120 are in the original state. Alternatively, the seed bits 122 may include a single bit set to one or a value associated with a high state when the inversion bit having a value of one indicates the data bits 120 are in the original state. Regardless of the inversion scheme selected, the parity calculation component 112 generates the calculated parity bits 118 based on the current state or value of the data bits 120 and the seed bits 122. Since, the parity calculation component 112 is configured to associate an odd number of inputs with each of the calculated parity bits 118, when the parity bits are calculated from the stored data bits 106 and the stored inversion bits 110, the parity encoding results in inverted parity bits if the data bits 120 are inverted when stored as the stored data bits 106 and the stored inversion bits 110 are set to the opposite state of the seed bits 122. Similarly, the parity encoding results will result in the original state of the parity bits if the stored data bits 106 remain in the origin state and the inversion bits 110 are set to the same state as the seed bits 122. Thus, following an activate command, when the stored parity bits 108 are compared with the parity bits calculated from the stored data bits 106 and the stored inversion bits 110 if no errors occurred, the calculated parity encoding results match the stored parity bits 108, indicating no errors.

Once the calculated parity bits 118 are generated by the parity calculation component 112, the calculated parity bits 118 and the data bits 120 are received by the majority detection component 114. The majority detection component 114 determines if the data bits 120 and the calculated parity bits 118 include more bits having a value of one (or a high state) or a value of zero (or a low state). If the data bits 120 and the calculated parity bits 118 include more bits having a value of one, the majority detection component 114 sets the inversion bits 124 to indicate that the data bits 120 and the calculated parity bits 118 should be inverted before storing in the memory array 104. Alternatively, if the data bits 120 and the calculated parity bits 118 include more bits having a value of zero, the majority detection component 114 sets the inversion bits 124 to indicate that the data bits 120 and the calculated parity bits 118 should remain un-inverted when stored in the memory array 104.

The inversion component 116 receives the data bits 120, the calculated parity bits 118, and the inversion bits 124. The inversion component 116 switches each of the values associated with the bits (e.g., ones to zeros or zeros to ones) when the inversion bits 124 is set or indicates the data bits 120 and the calculated parity bits 118 should be inverted. In this manner, a larger portion of the data bits 120 and the parity bits 118 being written into the memory array 104 have a value of zero and, thus, the overall or average energy consumption associated with writing the data bits 120 and the parity bits 118 into the array 104 is reduced when compared to always writing the data bits 120 and the parity bits 118 to the array 104 in the non-inverted state.

Once the data bits 120 and the calculated parity bits 118 have been possibly inverted by the inversion component 116, the memory device 100 stores the possibly inverted data bits 126, the possible inverted parity bits 128, and the inversion bits 124 in the memory array 104. The stored data bits 106, the stored parity bits 108 and the sorted inversion bits 110 may be accessed as part of the activate operations described in more detail below with respect to FIG. 3.

Figure 2:
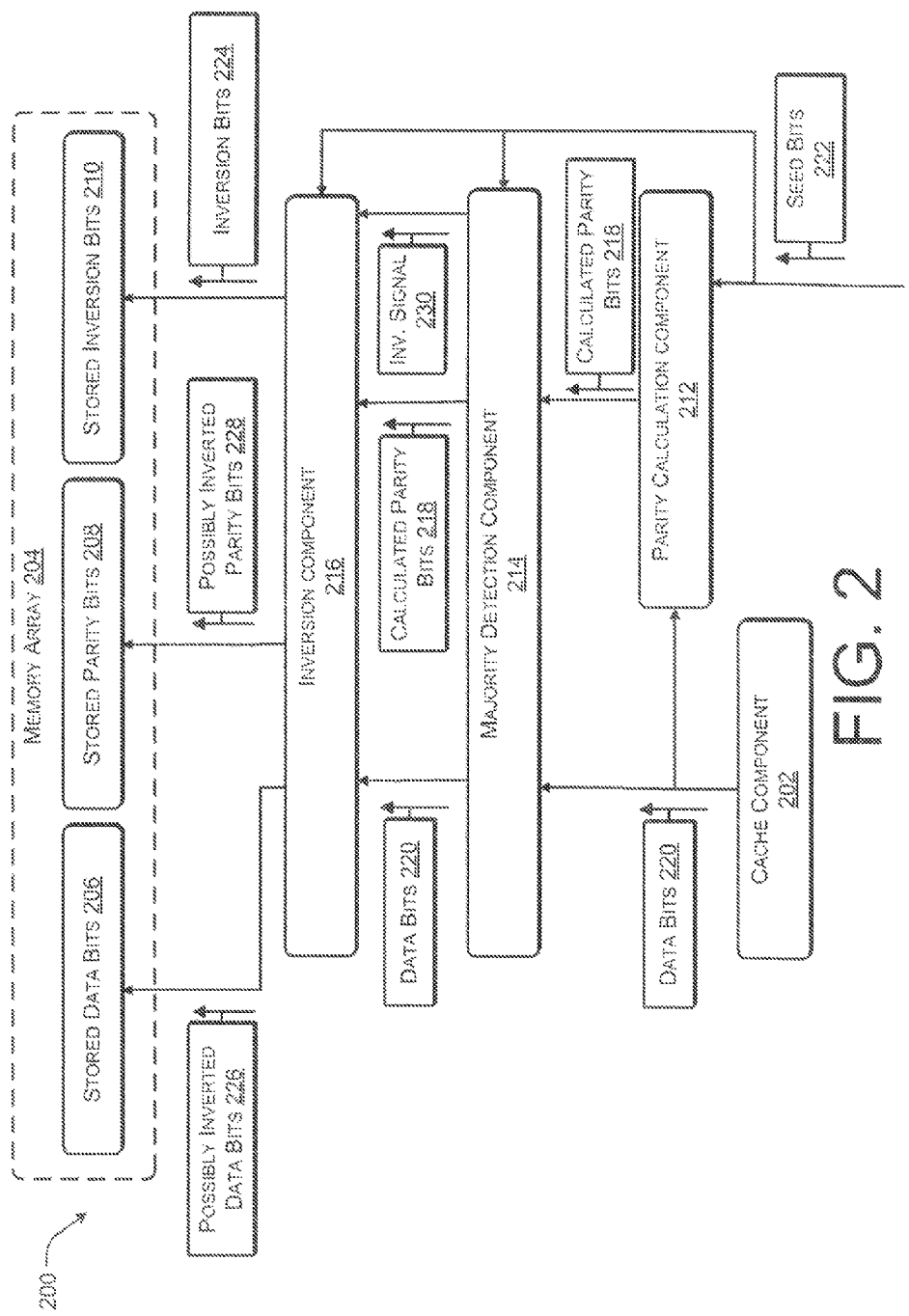
FIG. 2 illustrates a block diagram showing select components of a memory device according to some implementations.

FIG. 2 illustrates a block diagram showing select components of a memory device 200 according to some implementations. As in FIG. 1, in the illustrated example, data stored in a cache component 202 is being written back into the memory array 204 in response to receiving a precharge command. In the present example, the seed bits 222 (or the inversion bits 224) are included in the majority detection and the inversion scheme associated with the memory device 200 to further reduce the overall energy consumption associated with writing data into the memory array 204, as in some cases the seed bits 222 or the inversion bits 224 may influence the majority (e.g., ones or zeros) detected.

The memory device 200 includes one or more memory arrays, such as memory arrays 204. The memory array 204 may be configured to store data arranged in ECC words that include data bits 206, parity bits 208 (or check bits), and inversion bits 210. The data bits 206 contain data that is intended to be read from the memory array 204. The parity bits 208 are bits that are stored together with the data bits 206 and are utilized to determine whether an error has occurred with respect to the data bits 206. The inversion bits 210 are stored together with the data bits 206 and the parity bits 208 and indicate whether the data bits 106 and the parity bits 208 are stored in an original state or in an inverted state.

The memory device 200 includes a parity calculation component 212, a majority detection component 214, and an inversion component 216. The parity calculation component 212 may be configured to generate calculated parity bits 218 based at least in part on data bits 220 and one or more seed bits 222 received with regards to the precharge operations. The majority detection component 214 may be configured to determine the most common bit state associated with the data bits 220, the calculated parity bits 218 and the seed bits 222, and provide an invert signal 230 to the inversion component 216. The inversion component 216 may be configured to receive the data bits 220, the parity bits 218, the seed bits 222, and the inversion signal 230 and to invert the data bits 120, the parity bits 118, and the seed bits 222 (as the inversion bits 224) when the inversion signal 230 is received.

In some examples, the seed bits 222 may be a single bit set to zero for use in the parity calculation and the majority detection. When the seed bits 222 are set to zero and the inversion signal 230 is set by the majority detection component 214, the inversion component 216 may invert the seed bits 222 from zero to one causing the seed bits 222 to act as the inversion bits 224 indicating that the data bits 220 and the parity bits 218 have been inverted. In this example, when the inversion signal 230 is received by the inversion component 216, the seed bits 222 are inverted (and utilized as the inversion bits 224). Thus, the inversion bits 224 are stored in a manner accurately indicating that the stored data bits 206 and the stored parity bits 208 are inverted.

In general, following receipt of a precharge command, the data bits 220 stored in the cache component 202 and one or more seed bits 222 are received by a parity calculation component 216. In some implementations, the seed bits 222 is an inversion bit placed in the non-inverting state (e.g., zero). The parity calculation component 212 generates the calculated parity bits 218 based on the current state or value of the data bits 220 and the seed bits 222. Since, the parity calculation component 212 is configured to associate an odd number of inputs with each of the calculated parity bits 218 and when the data bits 220 are inverted, the inversion bits 224 are inverted from the seed bits 222, and the parity bits 218 are also inverted, parity bits calculated from the stored data bits 206 (following an activate command) match the stored parity bits 208 regardless of whether or not the data bits 206 are inverted when no errors have occurred.

Once the calculated parity bits 218 are generated by the parity calculation component 212, the calculated parity bits 218, the data bits 220, and the seed bits 222 are received by the majority detection component 214. The majority detection component 214 determines if the data bits 220, the calculated parity bits 218, and the seed bits 222 include more bits having a value of one (or a high state) or a value of zero (or a low state). If the data bits 220, the calculated parity bits 218, and the seed bits 222 include more bits having a value of one, the majority detection component 214 provides the inversion signal 230 to the inversion component 216 to indicate that the data bits 220, the calculated parity bits 218, and the seed bits 222 should be inverted before storing in the memory array 204. Alternatively, if the data bits 220, the calculated parity bits 218, and the seed bits 222 include more bits having a value of zero, the majority detection component 214 does not provide the inversion signal 230 causing the data bits 220, the calculated parity bits 218, and the seed bits 222 to be stored in the original form.

The inversion component 216 receives the data bits 220, the calculated parity bits 218, and the seed bits 222, as well as the inversion signal 230 when the data bits 220, the calculated parity bits 218, and the seed bits 222 are to be inverted. For example, when the inversion signal 230 is received from the majority detection component 214, the inversion component 216 switches each of the values associated with the data bits 220, the calculated parity bits 218, and the seed bits 222. In this manner, a larger portion of the data bits 220, the calculated parity bits 218, and the seed bits 222 (e.g., as the inversion bits 224) being written into the memory array 204 has a value of zero and, thus, the overall or average energy consumption associated with writing the data bits 220, the calculated parity bits 218, and the seed bits 222 into the array 204 is reduced when compared to always writing the data bits 220, the calculated parity bits 218, and the seed bits 222 to the array 204 in the original state.

Once the data bits 220, the calculated parity bits 218, and the seed bits 222 (as the inversion bits 224) have possibly been inverted by the inversion component 216, the memory device 200 stores the possibly inverted data bits 226, the possible inverted parity bits 228, and the inversion bits 224 in the memory array 204. The stored data bits 206, the stored parity bits 208 and the sorted inversion bits 210 may be accessed as part of the activate operations described in more detail below with respect to FIG. 3.

Figure 3:
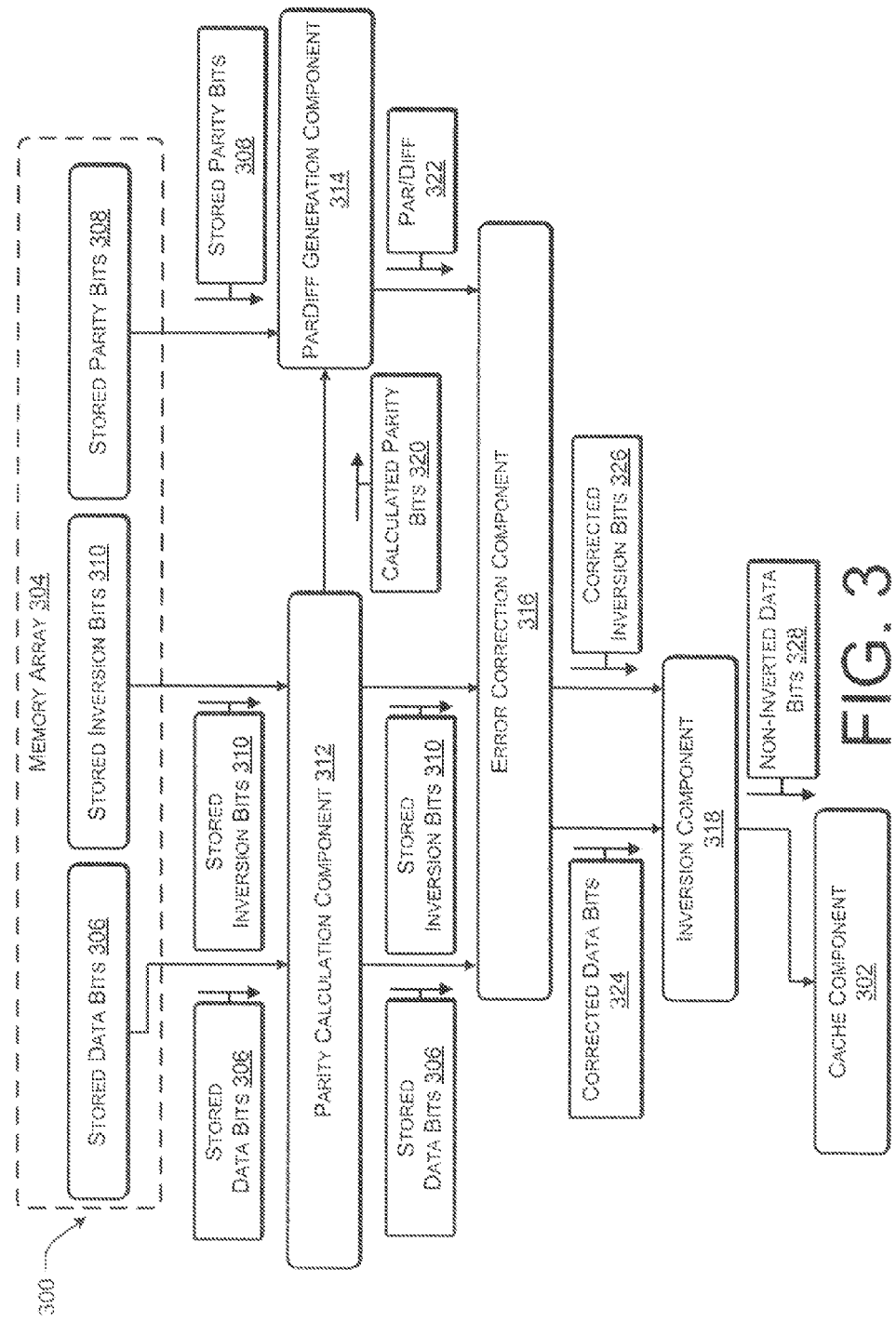
FIG. 3 illustrates a block diagram showing select components of a memory device according to some implementations.

FIG. 3 illustrates a block diagram showing select components of a memory device 300 according to some implementations. In the illustrated example, data stored in a memory array 304, as described above with respect to FIGS. 1 and 2, is being accessed and loaded into a cache component 302 in response to receiving an activate command form an external source (not shown).

The memory device 300 includes one or more memory arrays, such as memory arrays 304. The memory array 304 may be configured to store data according to ECC words including the stored data bits 306, the stored parity bits 308 (or check bits), and the stored inversion bits 310. The data bits 306 contain data, which is intended to be accessed from the memory array 304. The parity bits 308 are bits that are stored together with the data bits 306 and are utilized to determine whether an error has occurred during a read or write operation associated with the data bits 306. The inversion bits 310 are stored together with the data bits 306 and the parity bits 308 and indicate whether the data bits 306 and the parity bits 308 are stored in an original state or in an inverted state.

The memory device 300 also includes a parity calculation component 312, a parity/difference generation component 314, an error correction component 316, and an inversion component 318. The parity calculation component 312 may be configured to generate calculated parity bits 320 based at least in part on the stored data bits 306 and the stored inversion bits 310. The parity/difference generation component 314 may be configured to generate a parity/difference 322 based at least in part on the stored parity bits 308 and calculated parity bits 320. For example, the parity/difference generation component 314 may compare the values associated with each of the calculated parity bits 320 with the corresponding values of the stored parity bits 308. The error correction component 316 is configured to correct or switch the bits having an error as indicated by the parity/difference information 322. The inversion component 318 may be configured to receive the corrected data bits 324 and the corrected inversion bits 326 and to invert the corrected data bits 324 when the inversion bits 326 indicate the stored data bits 306 were inverted.

In general, following receipt of an activate command, the stored data bits 306 and the stored inversion bits 310 are provided to the parity calculation component 312. The parity calculation component 312 generates the calculated parity bits 320 based on the current state or value of the stored data bits 306 and the stored inversion bits 310. Since, the parity calculation component 312 is configured to associate an odd number of inputs with each of the calculated parity bits 320, the calculated parity bits 320 should match the stored parity bits 308 unless an error occurred with respect to the stored data bits 306, the stored inversion bits 310, or the stored parity bits 308 even when the stored parity bits 308 are calculated using the non-inverted bits and inverted while the calculated parity bits 320 are generated using the inverted bits, as will be described in more detail below with respect to FIG. 4.

Once the calculated parity bits 320 are generated by the parity calculation component 312, the calculated parity bits 320 and the stored parity bits 308 are received by the pardiff generation component 314. The parity/difference generation component 314 compares the stored parity bits 308 read from the memory array 304 with the calculated parity bits 320 to produce the parity/difference information 322. For example, the parity/difference generation component 314 may perform a series of exclusive OR operations on the calculated parity bits 320 and the stored parity bits 308 to produce the parity/difference information 322. In some cases, the parity/difference information 322 may be a multi-dimensional array or table, which provides information related to the number of errors and the identification of which of the stored data bits 306, the stored parity bits 308, and/or the stored inversion bits 310 contain the errors.

The error correction component 316 receives the stored data bits 306 and the stored inversion bits 310, as well as, the parity/difference information 322 from the parity/difference generation component 314. The error correction component 316 receives the stored inversion bits 310, as each of the inversion bits 310 has equal probability of an error as each of the stored data bits 306. In some implementations, the error correction component 316 may also receive the stored parity bits 308 read from the memory array 304 in the case where the parity must be corrected and stored.

In general, the error correction component 316 may be configured to identify if an error is present in the stored data bits 306 and the stored inversion bits 310 and to correct the error before the stored data bits 306 and the stored inversion bits 310 are provided to the inversion component 318. For instance, in response to detecting an error, the error correction component 316 may generate corrected data bits 324 and the corrected inversion bits 326 by flipping one or more of the stored data bits 306 and/or the stored inversion bits 310 based on the parity/difference information 322 and the type of error correction being implemented. For example, the error correction component 316 may be configured to perform single error correction in some implementations, while in other implementations, the error correction component 316 may be configured to correct for multiple errors, such as by implementing double error correction or multi-bit error correction.

The corrected data bits 324 and the corrected inversion bits 326 are received by the inversion component 318. The inversion component 318 may switch the value associated with each of the corrected data bits 324 based at least in part on the value associated with each of the corrected inversion bits 326. In this manner, the data bits 328 may be provided to the cache component 302 in the original state (e.g., the non-inverted state) from which the data bits 328 were loaded back into the memory array 304 from the cache component 302, as described above with respect to FIGS. 1 and 2.

Once the non-inverted data bits 328 are received in the cache component 302, an external source may access (e.g., read and write) the data bits 328, which in turn are loaded back into the memory array 304, as described above with respect to FIGS. 1 and 2.

Figure 4:
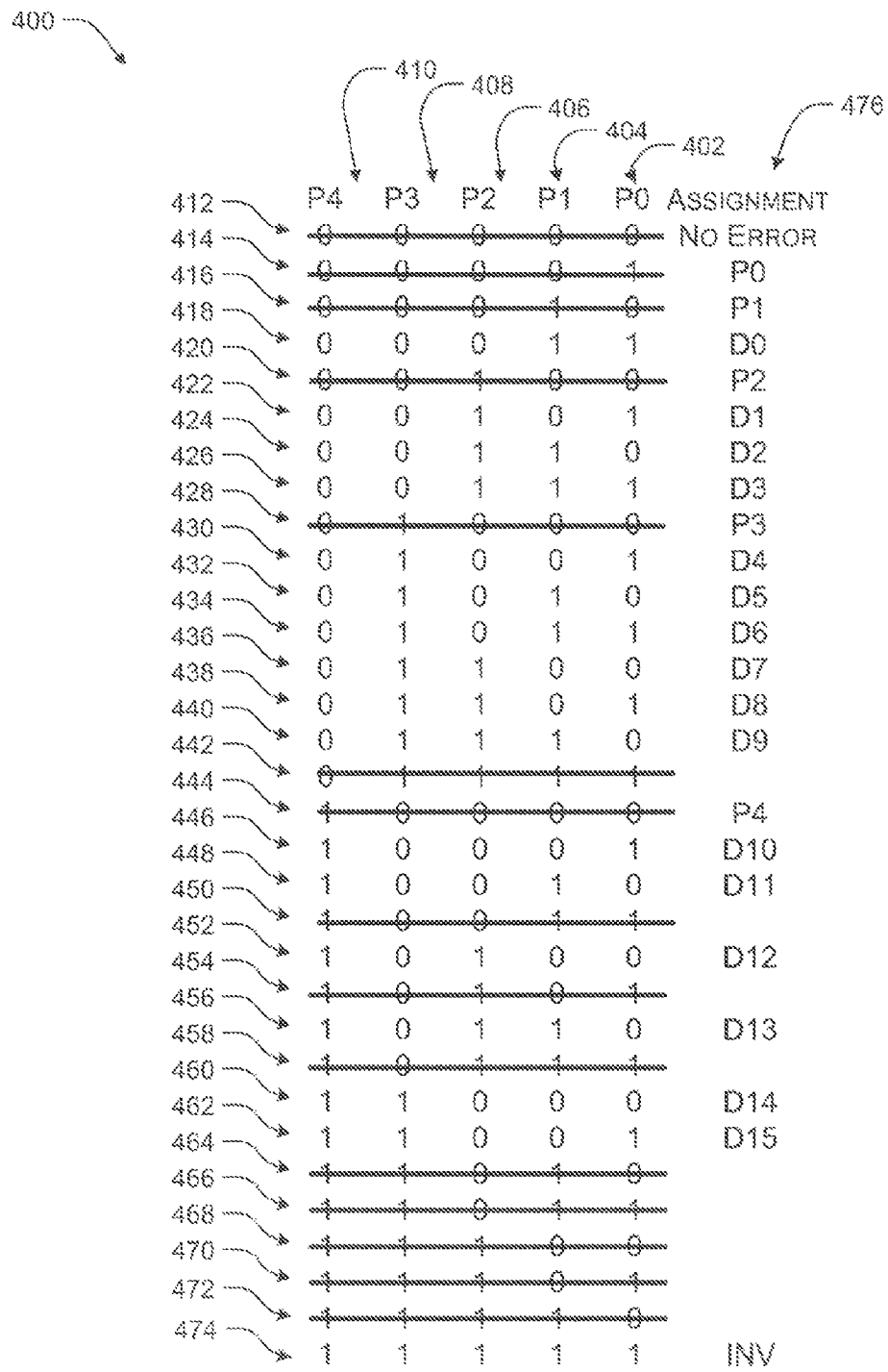
FIG. 4 illustrates an example parity scheme according to some implementations.

FIG. 4 illustrates an example parity scheme 400 according to some implementations. The illustrated example shows one possible parity scheme 400 for an ECC word associated with sixteen data bits labeled "0-15", five parity bits labeled "P0-P4", and an inversion bit labeled "INV." In the illustrated example, each of the parity bits "P0-P4" are associated with one of the column 402-410 and each of the thirty two possible parity assignments (e.g., each possible combination available using five parity bits) are shown as rows 412-474. However, since not all of thirty two parity encoding available when five parity bits are utilized need be assigned in the present example (e.g., an ECC word having sixteen data bits, five parity bits, and an inversion bit). Rather, twenty three of the thirty two parity encodings are assigned in the present example as illustrated by the designations in an assignment column 476. For instance, the encoding "0 0 0 0 0" may be associated with no errors, the encoding "0 0 0 0 1" may be associated with an error in the parity bit "P0," the encoding "0 0 0 1 1" may be associated with an error in the data bit "0" and so forth. In this manner, each row 412-474 having a designation in the assignment column 476 is utilized to indicate an error in the bit associated with the assignment column 476.

As discussed above, a parity scheme 400 is configured such that each of the parity bits "P0-P4" receive an odd number of inputs during calculation (e.g., one input for each of the rows 412-474 that are not illustrated with strikethrough and having a value of one in the column 402-410 associated with the corresponding parity bit "P0-P4"). When the parity scheme 400 is implemented by a memory device, the values associated with the parity bits generated when the data bits, and/or inversion bits are an inverted state are the same as the inverted values of the parity bits generated when the data bits, parity bits, and/or inversion bits are in an original or non-inverted state.

For instance, in the illustrated example, some of the rows (e.g., rows 412-416, 420, 428, 442, 444, 450, 454, 458, and 464-472) are illustrated as crossed out. In this example, the crossed out rows 412-416, 420, 428, 442, 444, 450, 454, 458, and 464-472 are not utilized in the parity bit calculation or in the XOR combination used to generated the value associated with the parity bits "P0-P4." Thus, in the illustrated example, the parity bit "P4" has seven inputs and may be calculated by XOR (the value of row 446 column 410, the value of row 448 column 410, the value of row 452 column 410, the value of row 456 column 410, the value of row 460 column 410, the value of row 462 column 410, the value of row 474 column 410) or XOR ("D10", "D11", "D12", "D13", "D14", "D15", "INV"). The parity bit "P3" has nine inputs and may be calculated by XOR (the value of row 430 column 408, the value of row 432 column 408, the value of row 434 column 408, the value of row 436 column 408, the value of row 438 column 408, the value of row 440 column 408, the value of row 460 column 408, the value of row 462 column 408, the value of row 474 column 408) or XOR ("D4", "D5", "D6", "D7", "D8", "D9", "D14", "D15", "INV"). The parity bit "P2" also has nine inputs and may be calculated by XOR (the value of row 422 column 406, the value of row 424 column 406, the value of row 426 column 406, the value of row 436 column 406, the value of row 438 column 406, the value of row 440 column 406, the value of row 452 column 406, the value of row 456 column 406, the value of row 474 column 406) or XOR ("D1", "D2", "D3", "D7", "D8", "D9", "D12", "D13", "INV"). The parity bit "P1" has nine inputs and may be calculated by XOR (the value of row 418 column 406, the value of row 424 column 404, the value of row 426 column 404, the value of row 432 column 404, the value of row 434 column 404, the value of row 440 column 404, the value of row 448 column 404, the value of row 456 column 404, the value of row 474 column 404) or XOR ("D2", "D3", "D5", "D6", "D9", "D11", "D13", "INV"). The parity bit "P0" has nine inputs and may be calculated by XOR (the value of row 418 column 402, the value of row 422 column 402, the value of row 426 column 402, the value of row 430 column 402, the value of row 434 column 402, the value of row 438 column 402, the value of row 446 column 402, the value of row 462 column 402, the value of row 474 column 402) or XOR ("D0", "D1", "D3", "D4", "D6", "D8", "D10", "D15", "INV").

In one specific example, assume the data bits "D15-D0" to be written from the cache to the memory array is equal to "0000000111111111", the inversion bit "INV" is initially set to "0" or non-inverted, and the stored parity bits "P4-P0" are calculated as "0, 1, 1, 1, 0" from the non-inverted data bits "D15-D0" and the non-inverted inversion bit "INV". In this example, a majority detection component, such as majority detection component 114 or 214 of FIGS. 1 and 2, receive the data bits "D15-D0", the parity bits "P4-P0", and the inversion bit "INV" and determine that the majority of bits have a value of one (e.g., twelve 1s and ten 0s). Therefore, the data bits "D15-D0" are inverted to "1111111000000000", the parity bits "P4-P0" are inverted to "1, 0, 0, 0, 1", and the inversion bit "INV" is set to "1" and stored in the memory array.

Now assume, the stored data bits "D15-D0", the stored parity bits "P4-P0", and the inversion bit "INV" are being accessed by an external source, as described above with respect to FIG. 3. In this example, the stored data bits "D15-D0" currently equal to "1111111000000000" and the stored inversion bit "INV" set to "1" is received by a parity calculation component, such as parity calculation component 312 of FIG. 3. Based on the XOR parity encoding scheme 400 as illustrated and discussed above, the parity bits calculated from the stored data bits "D15-D0" and the stored inversion bit "INV" is equal to "1, 0, 0, 0, 1". Therefore, if no errors occurred the stored and inverted parity bits are equal to "1, 0, 0, 0, 1" and the calculated parity bits are equal to "1, 0, 0, 0, 1". Thus, when a parity/difference generation component, such as parity/difference generation component 314, produces the parity/difference information from the stored and inverted parity bits and the calculated parity bits the encoding is equal to "0, 0, 0, 0, 0" or the parity encoding of row 412 and assigned a value of no errors.

Alternatively, assume an error was introduced into the stored data bits "D15-D0" at "D8" (indicated below as the underlined digit), such that the stored data bits "D15-D0" is equal to "111111110 0000000". In this alternative example, the parity bits generated by the parity calculation component are equal to "1, 1, 1, 0, 0". Thus, when the stored parity bits set to "1, 0, 0, 0, 1" (as described above) are compared with the calculated parity bits set to "1, 1, 1, 0, 0" by the parity/difference generation component, the parity/difference information or encoding output is equal to "0, 1, 1, 0, 1" which is an encoding represented by row 438 and assigned to indicate an error in the data bit "D8". Thus the error correction component is able to utilize the parity/difference information to determine that an error occurred in data bit "D8" and to switch the data bit "D8" before the data bits "D15-D0" are provided to the cache even though the stored parity bits were calculated in part on the original state of the data bits and inverted, while the calculated parity bits were calculated in part on the inverted data bits.

Thus, as illustrated by the example above, when a parity encoding is assigned such that each parity bit calculation has an odd number of inputs, the inverted parity bits generated based on the original data bits and the original inversion bits are equal to the parity bits generated based on the inverted data bits and inverted inversion bits. In this manner, the memory device is capable of storing the data bits, inversion bits, and/or parity bits in either an original or inverted state while still performing some level of error correction and maintaining the integrity of the data associated with other memory devices.

Figure 5:
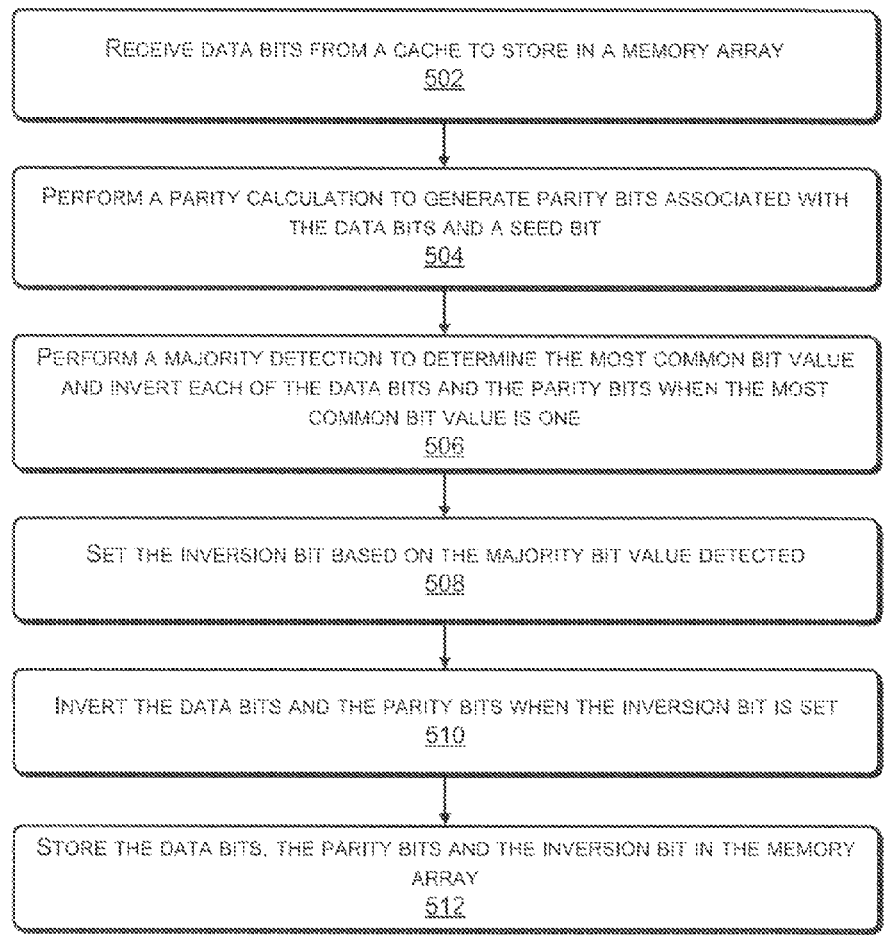
FIG. 5 illustrates an example flow diagram showing an illustrative process related to processing a precharge command at a memory device according to some implementations.
Figure 6:
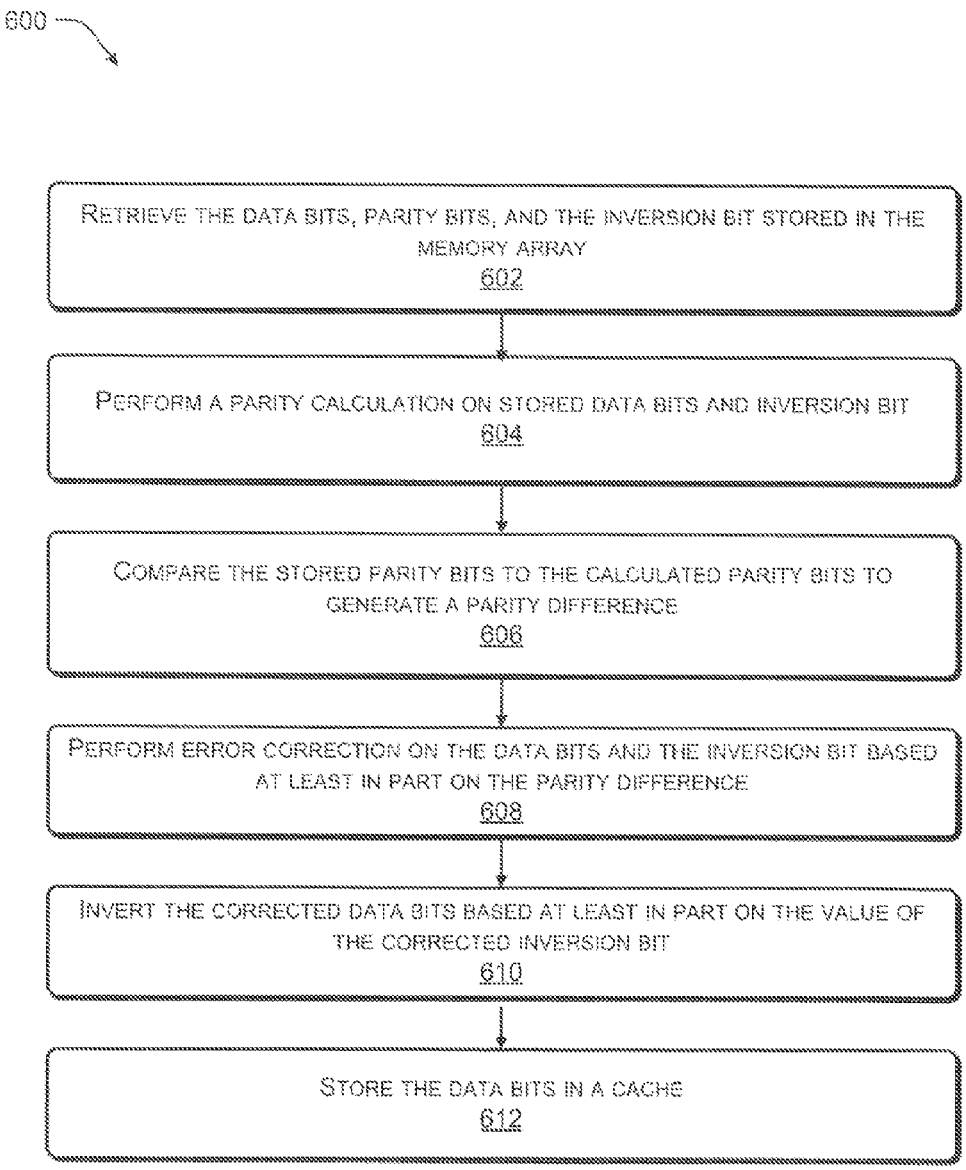
FIG. 6 illustrates an example flow diagram showing an illustrative process related to processing an activate command at a memory device according to some implementations.

FIGS. 5 and 6 are flow diagrams illustrating example processes of associated with accessing data stored in the memory device according to some implementations. The processes are illustrated as a collection of blocks in a logical flow diagram, which represent a sequence of operations, some or all of which can be implemented in hardware, software or a combination thereof. In the context of software, the blocks represent computer-executable instructions stored on one or more computer-readable media that, which when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 5 illustrates an example flow diagram showing an illustrative process 500 related to processing a precharge command at a memory device, such as memory devices 100, 200, and 300 of FIGS. 1-3, according to some implementations. In general, in response to receiving a precharge command the memory device loads the data currently stored in a cache component back into the corresponding memory array. In some examples, the parity bits may be included with the data bits in a majority detection scheme, while in other implementations, the inversion bit may be included in the ECC word associated with the data being stored in the memory array.

At 502, the memory device receives data bits from a cache. The data bits are to be stored in the memory array, for instance, back into the location in the memory array from which the data bits were originally retrieved. In some cases, the data bits are received from the cache and a seed bit that is set to the non-inverted state is received from a memory controller or other circuit associated with the memory device. In some implementations, the seed bit may be an inversion bit placed in the non-inverting state. For example, the seed bits may include a single seed bit set to zero or a value associated with a low state. Alternatively, the seed bits may include a single bit set to one or a value associated with a high state.

At 504, the memory device performs a parity calculation to generate parity bits associated with the data bits and the seed. For example, a parity calculation component may generate the parity bits based on the current state or value of the data bits and the seed bits. In some cases, the parity calculation component includes a parity scheme that has an odd number of inputs assigned to each of the calculated parity bits, for instance as described above with respect to FIG. 4. In this manner, when the parity bits are calculated from the data bits and the seed bit and inverted, the same parity encoding results as when the parity bits are calculated from the inverted data bits and the inverted inversion bit if no errors are present in the stored data bits, stored parity bits, or the stored inversion bit. Thus, following an activate command, when the parity bits are compared with the parity bits calculated from the stored data bits and the stored inversion bit if no errors occurred, the parity/difference information may include an encoding that indicate no errors occurred.

At 506, the memory device performs majority detection on the parity bits and the data bits to determine the most common bit value and invert each of the data bits and the parity bits when the most common bit value is one. For instance, a majority detection component may determine if the data bits and the parity bits include more bits having a value of one (or a high state) or a value of zero (or a low state). In some cases, in addition to the value of the data bits and the parity bits, the majority detection component may consider the value of the inversion bit and/or seed bit when determining the majority state.

At 508, the memory device sets the inversion bit based on the majority bit value detected (e.g., either zero or one). For example, if the data bits and the calculated parity bits include more bits having a value of one, the majority detection component sets the inversion bit to indicate that the data bits and the calculated parity bits should be inverted before storing in the memory array. Alternatively, if the data bits and the parity bits include more bits having a value of zero, the majority detection component sets the inversion bit to indicate that the data bits and the calculated parity bits should remain in the non-inverted state when stored in the memory array.

At 510, the memory device inverts the data bits and the parity bits when the inversion bit is set. For example, an inversion component may receive the data bits, the parity bits, and the inversion bit. The inversion component may switch each of the values associated with the data bits and parity bits (e.g., ones to zeros or zeros to ones) when the inversion bit is in the invert state.

At 512, the memory device stores the data bits, the parity bits, and the inversion bit in the memory array. By storing the data bits and the parity bits with the majority of bits being zero, the memory array consumes less overall power when the memory device implements self-referenced reads that cause the bits of the memory array to be reset to zero when the data is accessed. Thus, by inverting the data bits and parity bits when more ones than zeros are present in the non-inverted state, a larger portion of the data being written into the memory array has a value of zero and, thus, fewer bits associated with the memory array need be switched to store the data than when no inversion scheme is utilized.

FIG. 5 provides one example process 500 associated with performing the operation associated with a precharge command by the memory devices described herein. FIG. 6 provides one example process 600 associated with performing the operation associated with an activate command by the memory devices, such as when the data stored in the memory arrays by the process 500 are accessed by an external source.

FIG. 6 illustrates an example flow diagram showing an illustrative process 600 related to processing an activate command at a memory device according to some implementations. In general, in response to receiving an activate command a memory device loads the data currently stored in a memory array into a cache component for access and/or editing by an external source. In some examples, the data bits and the parity bits in the array may have been inverted when stored in order to reduce the energy consumption associated with some types of memory devices.

At 602, the memory device retrieves the data bits indicated as part of the activate command, as well as the parity bits and the inversion bit associated with the data bits. In some cases, the memory device retrieves an entire ECC word (e.g., the data bits, parity bits, and inversion bits) associated with the data bits indicated as part of the activate command in order to perform error correction on all of the data associated with the data bits being loaded into the cache. For instance, by implementing the inversion bit and majority detection scheme described above, if an error occurred in the inversion bit, each of the data bits would be flipped resulting in incorrect data being provide to the external source. Therefore, by including the inversion bit within the ECC word associated with the data bits, some cases in which an error may have occurred in the inversion bit may be corrected by an error correction component.

At 604, the memory device performs a parity calculation on the state data bits and the stored inversion bits. For example, a parity calculation component may be configured to generate calculated parity bits based on the current state or value of the stored data bits and the stored inversion bit by performing a series of exclusive or operations. In some implementations, the parity calculation component may be configured to receive an input an odd number for the exclusive or calculation associated with each of the calculated parity bits. By utilizing an odd number of inputs, the calculated parity bits match the stored parity bits unless an error occurred with respect to the stored data bits, the stored inversion bit, or the stored parity bits even if the stored parity bits are calculated using the non-inverted bits and inverted, while the calculated parity bits are generated using inverted bits.

At 606, the memory device compares the stored parity bits to the calculated parity bits to generate a parity/difference information or encodings. For example, a parity/difference generation component may compare the stored parity bits read from the memory array with the calculated parity bits to produce the parity/difference information.

At 608, the memory device performs error correction on the data bits and the inversion bit based at least in part on the parity difference information. For example, an error correction component may be configured to identify if an error is present in the stored data bits and/or and the stored inversion bit by analyzing the parity/difference information or encoding with regards to defined parity encodings assigned to each of the data bits, parity bits, and inversion bit. The error correction component may flip one or more bits when the parity/difference information indicates an error in specific bits. In some cases, the error correction component may be configured to perform single error correction in some implementations, while in other implementations, the error correction component may be configured to correct for multiple errors, such as by implementing double error correction or multi-bit error correction.

At 610, the memory device inverts the corrected data bits based at least in part on the value of the corrected inversion bit. For example, an inversion component may switch the value associated with each of the corrected data bits when the inversion bit is set or indicates that the data bits were stored in the inverted state. Alternatively, the inversion component may forgo switching the value associated with each of the corrected data bits when the inversion bit is not set or indicates that the data bits were stored in the non-inverted state.

At 612, the memory device stores or provides the data bits to the cache for access by the external source. In this manner, the memory device is able to implement self referencing reads which set the bits associated with the memory array to zero or the low state in response to accessing the data as part of an activate command, while reducing the overall power consumption associated with writing the data back into the array by arranging the data such that a majority of the bits are set to zero or placed in the low state when being written to the array. For instance, by arranging the data such that a majority of the bits are set to zero or placed in the low state when being written to the array, on average fewer of the bits being associated with the memory array are switched when data is being written to the array.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A memory device comprising:
   a memory array having a plurality of bits associated with an error correction code (ECC) word and configured to set the plurality of bits to a predefined state in response to reading the plurality of bits from the memory array, the plurality of bits associated with the ECC word including stored data bits, stored parity bits, and at least one stored inversion bit;
   a parity calculation component configured to generate calculated parity bits determined based at least in part on the stored data bits and the stored inversion bit;
   a parity/difference generation component configured to generate parity/difference information based at least in part on a comparison of the stored parity bits and the calculated parity bits; and
   an error correction component configured to identify and correct errors associated with particular bits of the stored data bits, the stored parity bits, or the at least one stored inversion bit.

2. The memory device as recited in claim 1, further comprising:
   a cache component for receiving the stored data bits after the error correction component identified and corrected the errors, the cache component configured to allow an external source to access the stored data bits.

3. The memory device as recited in claim 1, further comprising:
   an inversion component configured to invert a value associated with the stored data bits when the at least one stored inversion bit is determined to be set after the error correction component identified and corrected the errors.

4. The memory device as recited in claim 1, wherein the parity calculation component is configured to provide the stored data bits and the stored inversion bit to the error correction component.

5. The memory device as recited in claim 4, wherein the parity calculation component is configured to receive an odd number of inputs when generating each of the calculated parity bits.

6. The memory device as recited in claim 4, wherein the parity calculation component generates the stored parity bits before the stored parity bits are stored in the memory array based at least in part on at least one seed bit and data bits stored in a cache component.

7. The memory device as recited in claim 1, further comprising:
   a majority detection component that is configured to determine a majority state associated with the plurality of bits prior to the plurality of bits being stored in the memory array.

8. A memory device comprising:
   a cache component accessible to an external source;
   a parity calculation component configured to generated parity bits based in part on data bits received from the cache component and a seed bit, the seed bit being an inversion bit having a value representative of a non-inverting state;
   a majority detection component configured to identify a majority state associated with the data bits and the parity bits;
   an inversion component configured to invert the data bits and the parity bits when the majority state is in a first state; and
   a memory array to store the data bits and parity bits when the majority state is in a second state and to store the inverted data bits and the inverted parity bits when the majority state is the first state.

9. The memory device as recited in claim 8, wherein the inversion component sets an inversion bit when the majority state is the first state.

10. The memory device as recited in claim 8, wherein when the majority detection component determines the majority state based at least in part on the seed bit.

11. The memory device as recited in claim 8, wherein the first state is a high state and the second state is a low state.

12. The memory device as recited in claim 8, wherein the parity calculation component is configured to receive an odd number of inputs when generating each of the parity bits.

13. The memory device as recited in claim 8, wherein:
    the majority detection component sets an inversion bit when the majority state is the first state; and
    the data bits, the parity bits, and the inversion bit are associated with a single error correction code (ECC) word of the memory array.

14. The memory device as recited in claim 13, wherein the parity calculation component is configured to generate a first set of parity bits from the data bits and a second set of parity bits from the inverted data bits, the first set of parity bits matching the second set of parity bits when the first set of parity bits are inverted.

15. A method comprising:
receiving, by a memory device, an activate command at the memory device;
reading stored data bits, stored parity bits, and a stored inversion bit from a memory array, the stored data bits, the stored parity bits, and the stored inversion bit associated with one error correction code (ECC) word of the memory array, each of the stored data bits, the stored parity bits, and the stored inversion bit having a first state and a second state;
generating, by a parity calculation component of the memory device, calculated parity bits based at least in part on the stored data bits and the store inversion bit;
generating, by a parity/difference component of the memory device, a parity/difference encoding based at least in part on the calculated parity bits and the stored data bits;
generating, by an error correction component of the memory device, corrected data bits and a corrected inversion bit based at least in part on the parity/difference encoding; and
inverting, by an inversion component of the memory device, the corrected data bits when the corrected inversion bit is in the first state.

16. The method as recited in claim 15, wherein reading the stored data bits, the stored parity bits, and the stored inversion bit from the memory array causes the bits within the memory array to be set to the second state.

17. The method as recited in claim 15, wherein each of the calculated parity bits are generated based on an odd number of inputs.

18. The method as recited in claim 15, further comprising:
storing the inverted corrected data bits in a cache component when the corrected inversion bit is in the first state; and
storing the corrected data bits in the cache component when the corrected inversion bit is in the second state.

19. The method as recited in claim 15, further comprising:
receiving a precharge command at the memory device;
accessing data stored in cache bits;
generating parity bits from the cache bits and at least one seed bit, the at least one seed bit set to the second state;
identifying a majority state associated with the cache bits and the parity bits generated from the cache bits and the at least one seed bit and wherein:
when the majority state is the first state:
inverting the cache bits and the parity bits generated from the cache bits;
setting the inversion bit to the first state;
storing the inverted cache bits, the inverted parity bits generated from the cache bits, and the inversion bit within the memory array;
when the majority state is the second state:
storing the cache bits, the parity bits generated from the cache bits, and the seed bit within the memory array.

20. The method as recited in claim 15, wherein the first state is a high state and the second state is a low state.

* * * * *